(12) United States Patent
Yan

(10) Patent No.: US 7,556,894 B2
(45) Date of Patent: Jul. 7, 2009

(54) MASK WITH MINIMUM REFLECTIVITY OVER ABSORBER LAYER

(75) Inventor: Pei-Yang Yan, Saratoga, CA (US)

(73) Assignee: Intel Corporation, Santa Clara, CA (US)

(*) Notice: Subject to any disclaimer, the term of this patent is extended or adjusted under 35 U.S.C. 154(b) by 477 days.

(21) Appl. No.: 11/475,474

(22) Filed: Jun. 26, 2006

(65) Prior Publication Data

US 2007/0026323 A1    Feb. 1, 2007

Related U.S. Application Data

(63) Continuation of application No. 10/339,617, filed on Jan. 8, 2003, now Pat. No. 7,118,832.

(51) Int. Cl.
*G03F 1/00* (2006.01)
(52) U.S. Cl. .......................................................... 430/5
(58) Field of Classification Search ...................... 430/5; 378/35
See application file for complete search history.

(56) References Cited

U.S. PATENT DOCUMENTS

| 6,013,399 | A | 1/2000 | Nguyen |
| 6,479,195 | B1 | 11/2002 | Kirchauer et al. |
| 6,506,526 | B2 | 1/2003 | Stivers et al. |
| 6,699,625 | B2 | 3/2004 | Lee et al. |
| 6,720,118 | B2 | 4/2004 | Yan et al. |
| 6,908,714 | B2 | 6/2005 | Yan et al. |
| 6,986,971 | B2 * | 1/2006 | Han et al. ..................... 430/5 |
| 2003/0039922 | A1 | 2/2003 | Han et al. |
| 2004/0091789 | A1 | 5/2004 | Han et al. |

OTHER PUBLICATIONS

Pei-Yang Yan et al., "TaN EUVL Mask Fabrication and Characterization", Proc. SPIE vol. 4343 (2001), pp. 409-414.

* cited by examiner

*Primary Examiner*—Stephen Rosasco
(74) *Attorney, Agent, or Firm*—George Chen

(57) ABSTRACT

A reflective mask may include an anti-reflective (AR) coating on an absorber layer to improve inspection contrast in an inspection system using deep ultraviolet (DUV) light. A silicon nitride ($Si_3N_4$) AR coating may be used on a chromium (Cr) or tantalum nitride (TaN) absorber layer.

9 Claims, 6 Drawing Sheets

MASK WITH MINIMUM REFLECTIVITY OVER ABSORBER LAYER

This is a Continuation Application of Ser. No. 10/339,617, filed on Jan. 8, 2003, now U.S. Pat. No. 7,118,832.

BACKGROUND

Masks used in lithography systems may be inspected by comparing light transmitted in the patterned (or "line") region of the mask to the light transmitted in the non-patterned (or "space") region. The defect detection sensitivity of the inspection system may depend on the difference in contrast between light transmitted in the two regions. Conventional transmissive optical masks may exhibit high inspection contrast since the light will either pass through the mask in the space region or will be blocked by the line region.

Low inspection contrast may present a problem in the inspection of reflective masks. Light absorber materials in the patterned region may typically reflect about 25% to about 45% of incident deep ultraviolet (DUV) light used for inspection purposes. The particular wavelength of the DUV inspection light is primarily determined by the inspection sensitivity requirement, typically in a range of about 150 nm to about 250 nm for extreme ultraviolet lithography (EUVL) mask inspection. The reflector region (e.g., the non-patterned region) may typically reflect about 60% of the DUV inspection light. As a result, the signal contrast between the patterned and non-patterned regions may be relatively low. In addition, there may be interference effects between the reflected light in the two regions due to the step height of the absorber. This interference effect may cause reflectance oscillation near the absorber edges, which may reduce the defect inspection sensitivity.

DETAILED DESCRIPTION

Figure 1:
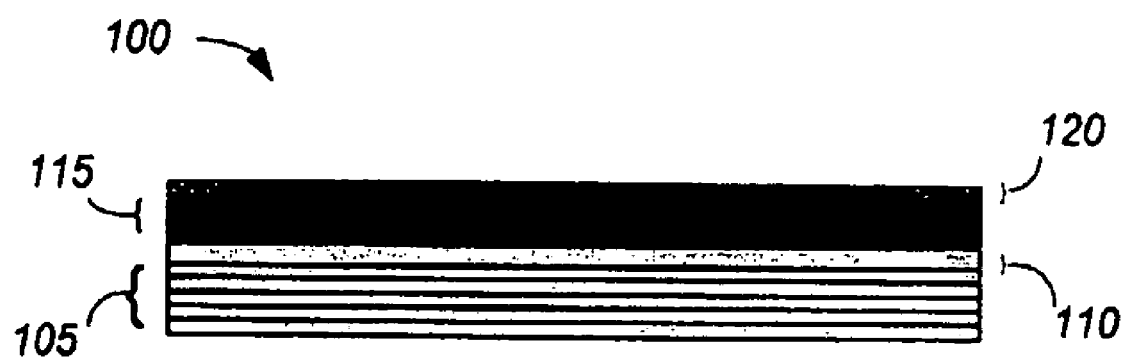
FIG. 1 is a sectional view of a reflective mask.

FIG. 1 shows a reflective mask 100. The mask may be used in an extreme ultraviolet lithography (EUVL) system, which may use EUV radiation with wavelengths in a range of 10 nm to 14 nm to carry out projection imaging on a semiconductor wafer.

The mask may include multilayer thin films (ML) 105, a buffer layer 110, and an absorber layer 115 with an anti-reflective (AR) coating 120. The ML may include a large number of alternating layers of materials having dissimilar EUV optical constants. The alternating layers may be molybdenum (Mo) and silicon (Si), which may function well for wavelengths in the EUV spectrum.

The buffer layer 110 may be, e.g., ruthenium (Ru). The buffer layer may be used to protect the underneath ML during the repair of defects in the absorber layer which may occur during pattern formation.

In an embodiment, the absorber layer 115 may include, e.g., chromium (Cr) or tantalum nitride (TaN), with a silicon nitride ($Si_3N_4$) AR coating 120. The absorber material in the absorber layer may be patterned such that absorber material is in the patterned (or "line") region and the ML reflector is exposed in the non-patterned (or "space") region.

Figure 2:
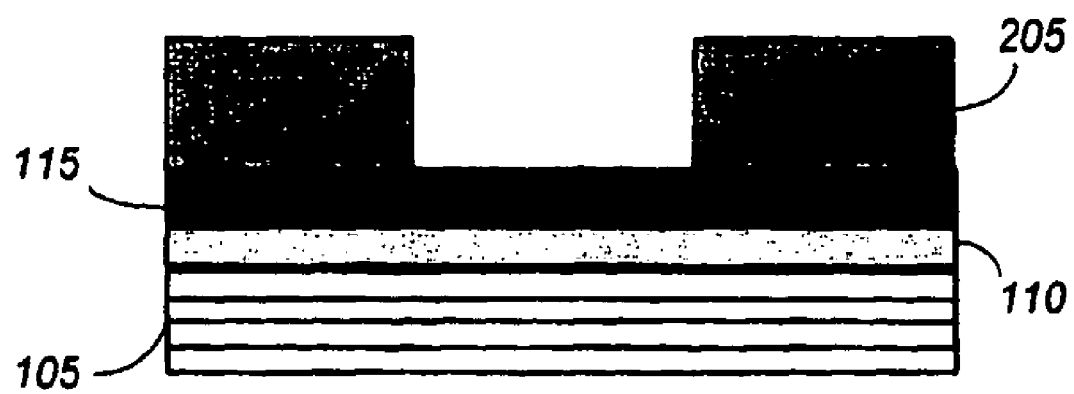
FIG. 2 is a sectional view of blank reflective mask with a layer of resist material deposited during a mask fabrication process.
Figure 3:
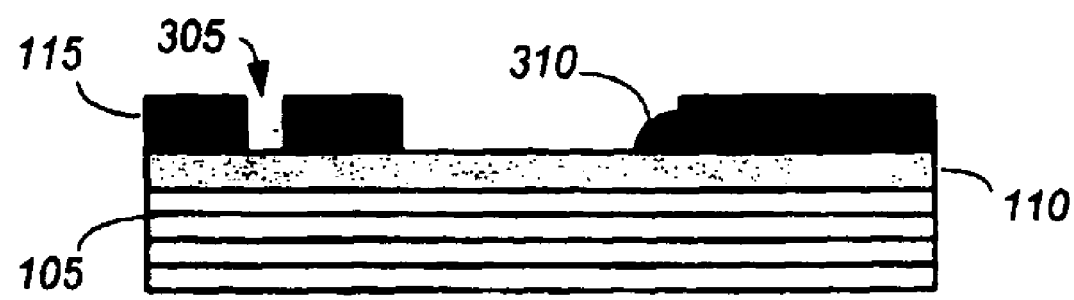
FIG. 3 is a sectional view of a patterned mask with defects.

A resist material 205 may be deposited on a blank reflective mask and then patterned and developed, as shown in FIG. 2. The absorber layer 115 may be etched to translate the pattern of the resist coating 205 to the absorber layer. However, defects may occur in the patterned absorber layer, such as the cavity 305 and the extra absorber defect 310 shown in FIG. 3.

Figure 4:
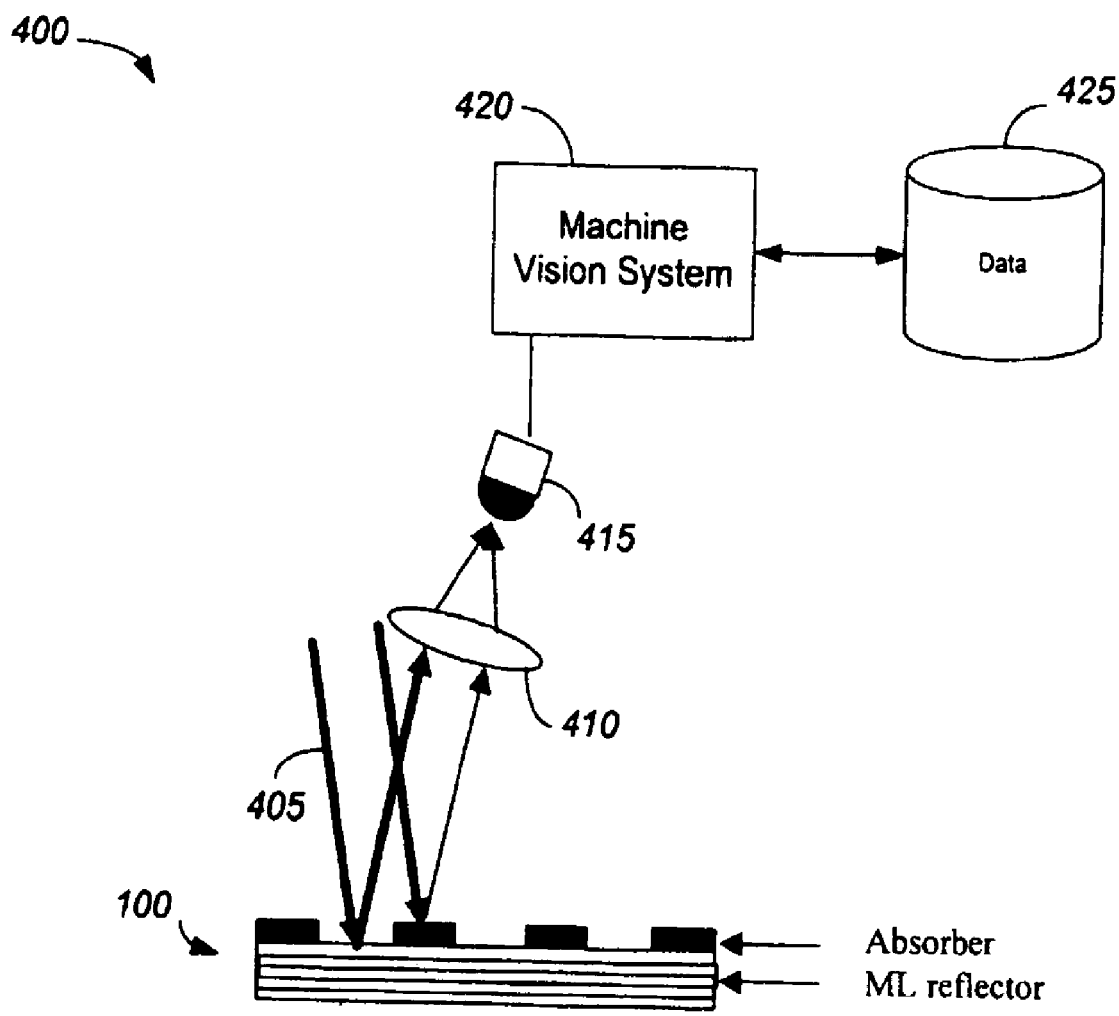
FIG. 4 is a block diagram of a mask inspection system.
Figure 5:
FIG. 5 is a sectional view of the mask of FIG. 3 with repaired defects.
Figure 6:
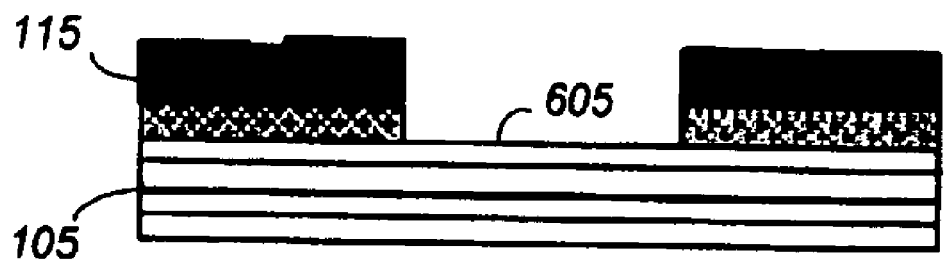
FIG. 6 is a sectional view of a patterned mask with an exposed multilayer thin film (ML) reflector region.

The mask pattern may be inspected to determine if the pattern contains defects. The defects may then be repaired if necessary. FIG. 4 shows a reflective mask inspection system 400. The absorber layer pattern may be inspected by reflecting deep ultraviolet (DUV) radiation 405 off of the reflective mask 100 onto an image plane 410. The DUV inspection wavelength may be in a range of about 150 nm to about 250 nm. The reflected pattern may be captured by an image sensor 415. A machine vision system 420 may compared with the light received from the line and space regions with a desired pattern stored in a database 425. Any defects may then be repaired using, e.g. a filler material 500, as shown in FIG. 5. The buffer layer may then be removed to expose the ML reflector 105 in a space region 605, as shown in FIG. 6, and another inspection may be performed.

The accuracy of the inspection system 400 may depend on the degree of contrast between the light reflected in the line region (I(line)) and the light reflected in the space region (I(space)). Contrast may be determined using the following formula:

$$\text{Contrast} = \frac{I(\text{space}) - I(\text{line})}{I(\text{space}) + I(\text{line})}$$

For the reflective mask shown in FIG. 1, I(line) may be about 25% to about 45% and I(space) may be about 60%. This may provide a contrast of only about 14% to about 30%.

For an AR coating on an absorbing material, the reflectance at the top surface may be given by the following equation:

$$R = \frac{(g_1^2 + h_1^2)e^{2\alpha_1} + (g_2^2 + h_2^2)e^{-2\alpha_1} + A\cos 2\gamma_1 + B\sin 2\gamma_1}{e^{2\alpha_1} + (g_1^2 + h_1^2)(g_2^2 + h_2^2)e^{-2\alpha_1} + C\cos 2\gamma_1 + D\sin 2\gamma_1} \quad (1)$$

where $$A = 2(g_1 g_2 + h_1 h_2),$$

$$B = 2(g_1 h_2 - g_2 h_1),$$

$$C = 2(g_1 g_2 - h_1 h_2),$$

$$D = 2(g_1 h_2 + g_2 h_1)$$

$$g_1 = \frac{n_0^2 - n_1^2 - k_1^2}{(n_0 - n_1)^2 + k_1^2},$$

-continued $$g_2 = \frac{n_1^2 - n_2^2 + k_1^2 - k_2^2}{(n_1 + n_2)^2 + (k_1 + k_2)^2},$$

$$h_1 = \frac{2n_0 k_1}{(n_0 - n_1)^2 + k_1^2},$$

$$h_2 = \frac{2(n_1 k_2 - n_2 k_1)}{(n_1 + n_2)^2 + (k_1 + k_2)^2}$$

$$\alpha_1 = \frac{2\pi k_1 d_1}{\lambda}, \gamma_1 = \frac{2\pi n_1 d_1}{\lambda}$$

Figure 7:
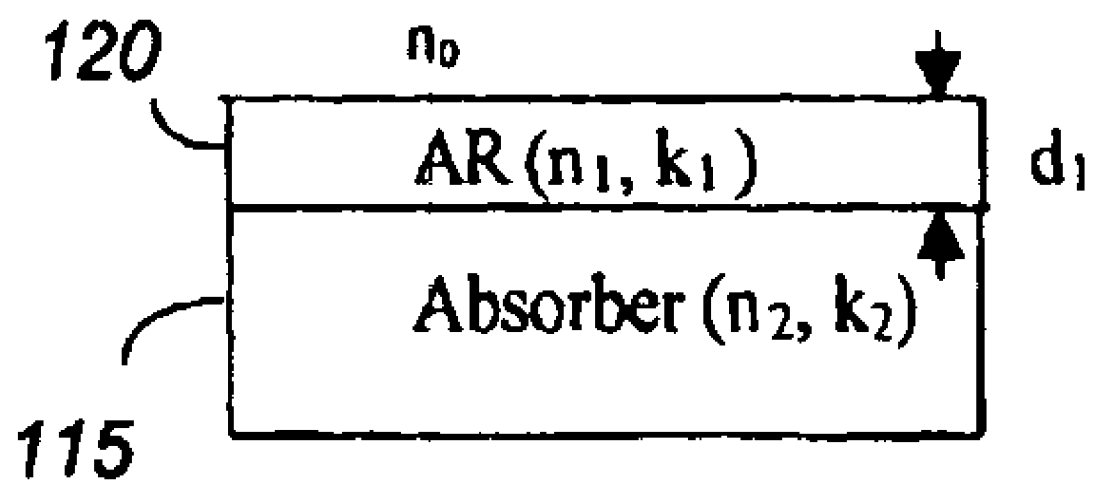
FIG. 7 is a sectional view of an absorber layer with an anti-reflective (AR) coating.

In the above equations, $d_1$ is the thickness of the AR coating, $n_1$ is the index of refraction of the AR material, $n_2$ is the index of refraction of the absorber material, and $k_1$ are $k_2$ are the absorption coefficients of the AR and absorber materials, respectively. (see FIG. 7). For equation (1), tantalum nitride (TaN) and chromium (Cr) absorber layers which are about 70 nm thick or thicker may be treated as bulk materials, e.g., incident radiation will not be reflected from the back surface of the absorber layer.

A minimum reflectivity may be obtained with an AR material having $n_1$, $k_1$, and a thickness $d_1$ which satisfy the following derivative conditions:

$$\frac{dR}{dn_1} = 0, \frac{dR}{dk_1} = 0, \text{ and } \frac{dR}{dd_1} = 0.$$

Therefore, to obtain minimum reflectivity for a given absorber ($n_2$, $k_2$), only materials with $n_1$, $k_1$, and a thickness $d_1$ that satisfy the three derivative equations may yield the best anti-reflection effect.

The optics constants of silicon nitride ($Si_3N_4$) may match well with that of TaN and Cr. An $Si_3N_4$ AR coating has been found to provide a very low reflectance at DUV inspection wavelengths. The thickness of the $Si_3N_4$ AR coating 120 may be between about 50 Å to 250 Å for DUV inspection wavelengths of 150 nm to 250 nm. The thickness of the $Si_3N_4$ AR coating 120 may be selected to yield a near zero reflection at a desired DUV inspection wavelength.

Figure 8:
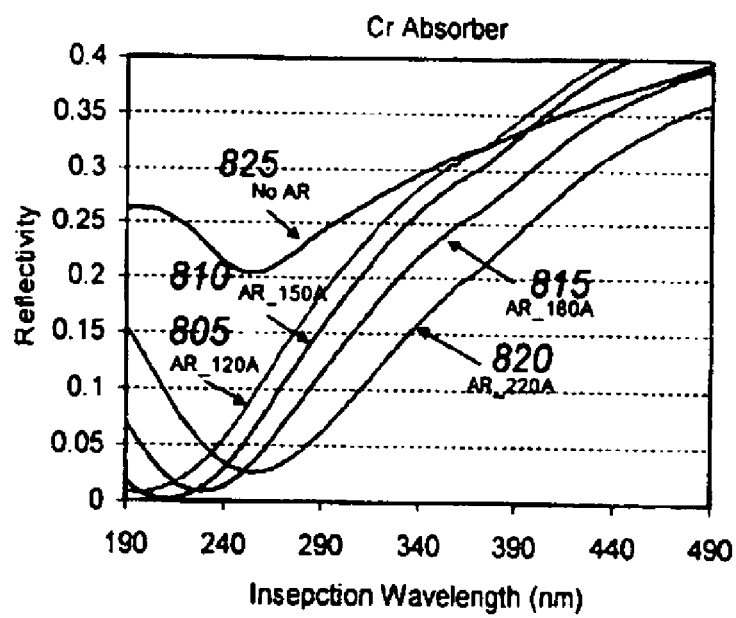
FIG. 8 is a graph showing reflectivity responses of silicon nitride ($S_i3N_4$) AR coatings of different thicknesses on a chromium (Cr) absorber layer.

FIG. 8 shows experimentally obtained reflectivity responses for $Si_3N_4$ AR coatings on a Cr absorber. Reflectivity responses were recorded for $Si_3N_4$ AR coatings with thicknesses of 120 Å 805, 150 Å 810, 180 Å 815, and 220 Å 820 and the case of no AR coating 825 over inspections wavelengths of 190 nm to 490 nm. As shown in FIG. 8, the reflectivity minimum moves from 250 nm to 235 nm when the AR thickness changes from 220 Å to 180 Å. The $Si_3N_4$ AR coating may be extended to inspection wavelengths below 190 nm by varying the AR coating thickness.

Figure 9:
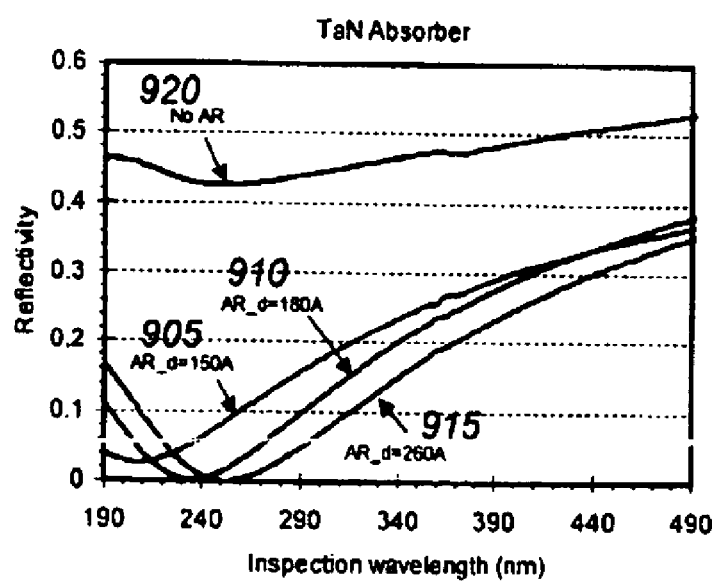
FIG. 9 is a graph showing reflectivity responses of $S_i3N_4$ AR coatings of different thicknesses on a tantalum nitride (TaN) absorber layer.

FIG. 9 shows experimentally obtained reflectivity responses for $Si_3N_4$ AR coatings on a TaN absorber. Reflectivity responses were recorded for $Si_3N_4$ AR coatings with thicknesses of 150 Å 905, 180 Å 910, and 260 Å 915 and the case of no AR coating 920 over inspections wavelengths of 190 nm to 490 nm. As shown in FIG. 9, the reflectivity minimum moves from 250 nm to 235 nm when the AR thickness changes from 260 Å to 180 Å. The $Si_3N_4$ AR coating may be extended to inspection wavelengths below 190 nm by varying the AR coating thickness.

With the $Si_3N_4$ AR coating on a TaN or Cr absorber layer, the inspection contrast may be increased from about 14% to about 30% to greater than 96%. As a result of reduced reflection in the absorber region, many undesired effects during reflective EUV lithography (EUVL) mask inspection, such as interference effects, may be reduced or eliminated. Furthermore, the inspection sensitivity may be greatly enhanced.

With the $Si_3N_4$ AR coating on a TaN or Cr absorber layer, the inspection contrast may be increased from about 14% to about 30% to greater than 96%. Nevertheless, it will be understood that various modifications may be made without departing from the spirit and scope of the invention. Accordingly, other embodiments are within the scope of the following claims.

The invention claimed is:

1. A mask comprising:
    a non-patterned region, said non-patterned region comprising:
        a multilayer (ML) reflector to reflect EUV light, said EUV light having wavelength of 10-14 nanometers, and
        a buffer layer disposed over said ML reflector; and
    a patterned region adjacent to said non-patterned region, said patterned region comprising:
        an absorber layer to absorb said EUV light, and
        an anti-reflective coating (ARC) disposed over said absorber layer, said ARC including silicon nitride, said ARC having a thickness of 150-180 Angstroms, wherein said patterned region has a reflectivity with a minimum for DUV light having wavelength of 190-250 nanometers.

2. The mask of claim 1 wherein said buffer layer comprises Ruthenium (Ru).

3. The mask of claim 1 wherein said absorber layer comprises Tantalum Nitride (TaN) having a thickness of 70 nanometers or thicker.

4. The mask of claim 1 wherein said non-patterned region has a reflectivity of 0.60 for said DUV light.

5. The mask of claim 1 wherein said patterned region has a reflectivity of 0.10 or less for said DUV light.

6. The mask of claim 1 wherein said absorber layer comprises a defect which may occur during formation of said patterned region.

7. The mask of claim 6 wherein said defect comprises a cavity.

8. The mask of claim 6 wherein said defect comprises an extra absorber defect.

9. The mask of claim 6 wherein said DUV light is used in an inspection of said mask to detect said defect.

* * * * *